(12) United States Patent
Vyssotski et al.

(10) Patent No.: US 9,189,658 B2
(45) Date of Patent: Nov. 17, 2015

(54) SYSTEM AND METHOD FOR DETECTING STATES

(71) Applicants: Nikolai Vyssotski, Austin, TX (US); Richard Tonry, Austin, TX (US)

(72) Inventors: Nikolai Vyssotski, Austin, TX (US); Richard Tonry, Austin, TX (US)

(73) Assignee: Dell Products L.P., Round Rock, TX (US)

( * ) Notice: Subject to any disclaimer, the term of this patent is extended or adjusted under 35 U.S.C. 154(b) by 78 days.

(21) Appl. No.: 14/248,910

(22) Filed: Apr. 9, 2014

(65) Prior Publication Data

US 2014/0218174 A1 Aug. 7, 2014

Related U.S. Application Data

(63) Continuation of application No. 12/553,806, filed on Sep. 3, 2009, now Pat. No. 8,710,959.

(51) Int. Cl.
| | |
|---|---|
| H04Q 5/22 | (2006.01) |
| G06K 1/00 | (2006.01) |
| G06F 1/22 | (2006.01) |
| H01L 21/00 | (2006.01) |

(52) U.S. Cl.
CPC .. *G06K 1/00* (2013.01); *G06F 1/22* (2013.01); *H01L 21/00* (2013.01)

(58) Field of Classification Search
CPC .................................. G06F 1/00; H01L 21/00
See application file for complete search history.

(56) References Cited

U.S. PATENT DOCUMENTS 6,566,905 B2 * 5/2003 Sanzo et al. .................... 326/37

* cited by examiner

*Primary Examiner* — Shirley Lu
(74) *Attorney, Agent, or Firm* — Baker Botts L.L.P.

(57) ABSTRACT

Systems and methods for detecting states are disclosed. An information handling system may include a processor and a plurality of information handling resources communicatively coupled to the processor via the common control line. The processor may be configured to produce a first signal on a common control line. Each of the plurality of information handling resources may include a tag having a signal threshold, the tag configured to communicate a second signal via the common control line indicating the presence of the particular information handling resource in response to the first signal exceeding the signal threshold of the tag.

13 Claims, 2 Drawing Sheets

SYSTEM AND METHOD FOR DETECTING STATES

CROSS-REFERENCE TO RELATED APPLICATION

The present application is a continuation application of co-pending U.S. patent application Ser. No. 12/553,806 filed Sep. 3, 2009, incorporated by reference herein in its entirety for all purposes.

TECHNICAL FIELD

The present disclosure relates in general to detecting various states in a system, and more particularly to detecting the presence of information handling resources in an information handling system.

BACKGROUND

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

Information handling systems often include one or more optional features or devices. Typically, the presence or absence of such features or devices is indicated by communicating a signal indicative of the particular feature or device to a controller, microprocessor, or other device. Traditionally, each such signal is communicated to a corresponding pin of the controller/microprocessor. As number of optional features and devices increases, the number of pins on the controller/microprocessor also increases, thus potentially leading to increased cost and hardware complexity.

SUMMARY

In accordance with the teachings of the present disclosure, the disadvantages and problems associated with detecting states may be reduced or eliminated.

In accordance with one embodiment, an information handling system may include a processor and a plurality of information handling resources communicatively coupled to the processor via the common control line. The processor may be configured to produce a first signal on a common control line. Each of the plurality of information handling resources may include a tag having a signal threshold, the tag configured to communicate a second signal via the common control line indicating the presence of the particular information handling resource in response to the first signal exceeding the signal threshold of the tag.

In accordance with another embodiment of the present disclosure, an information handling resource may include a tag. The tag may have a signal threshold and may be configured to be coupled to a common control line common to the information handling resource and one or more other information handling resources, and further configured to, in response to receiving a first signal exceeding the signal threshold via the common control line, communicate a second signal via the common control line indicating the presence of the information handling resource.

In accordance with a further embodiment of the present disclosure, a method for detecting state is provided. The method may include receiving a first signal at a tag having a signal threshold. The method may further include communicating a second signal from the tag indicating presence of the state in response to the first signal exceeding the signal threshold.

Other technical advantages will be apparent to those of ordinary skill in the art in view of the following specification, claims, and drawings.

BRIEF DESCRIPTION OF THE DRAWINGS

A more complete understanding of the present embodiments and advantages thereof may be acquired by referring to the following description taken in conjunction with the accompanying drawings, in which like reference numbers indicate like features, and wherein.

DETAILED DESCRIPTION

Figure 1:
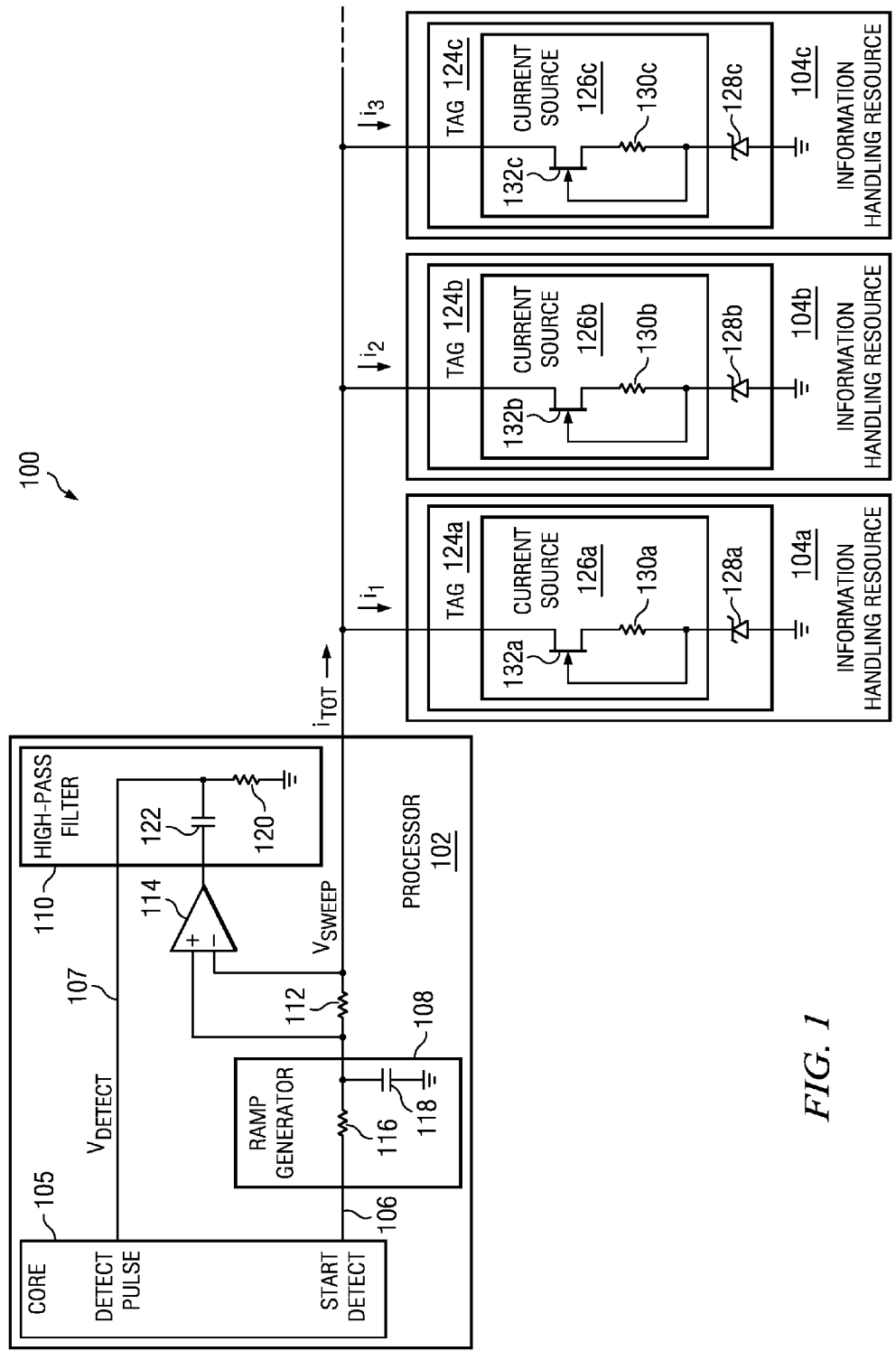
FIG. 1 illustrates a block diagram of an example information handling system, in accordance with the teachings of the present disclosure.
Figure 2:
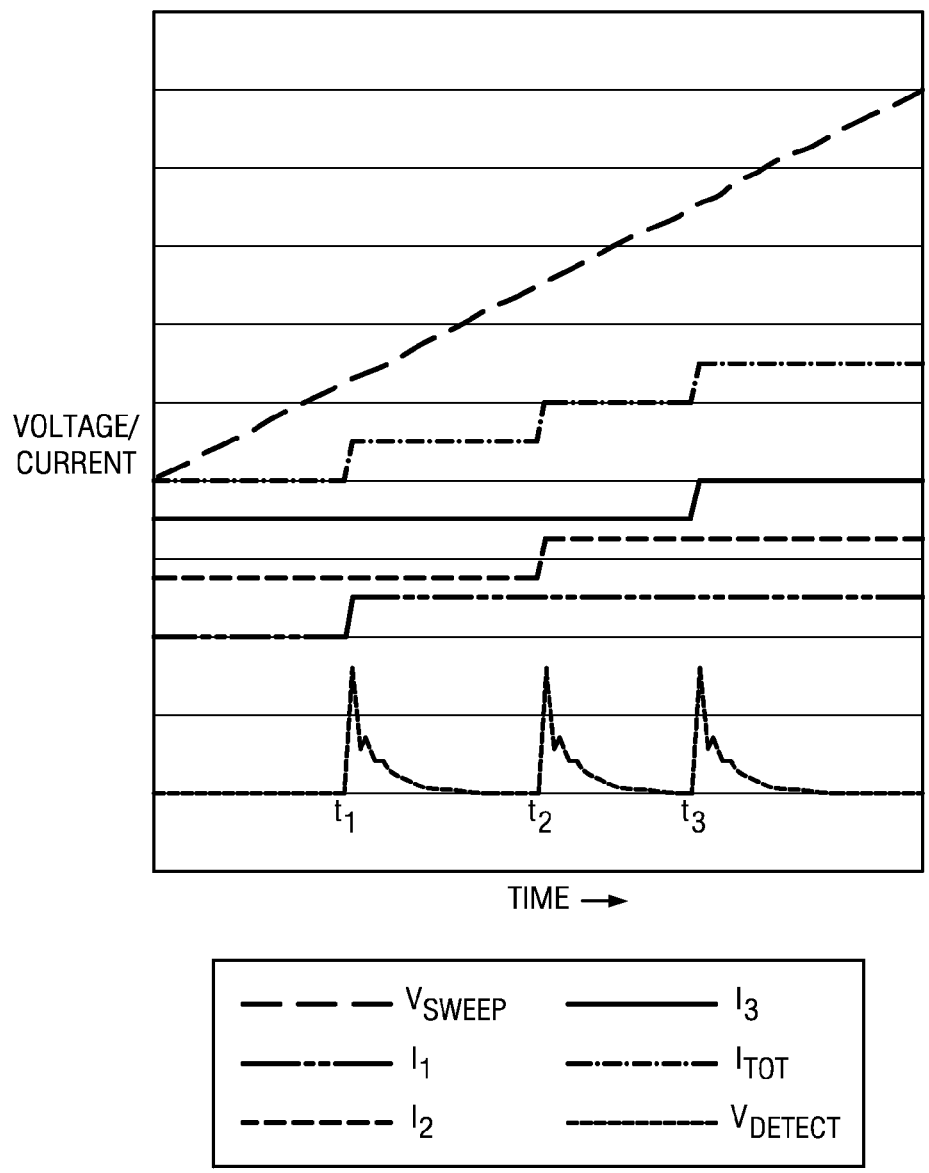
FIG. 2 illustrates a graph of a example voltages and currents during operation of the information handling system depicted in FIG. 1, in accordance with the teachings of the present disclosure.

Preferred embodiments and their advantages are best understood by reference to FIGS. 1 and 2, wherein like numbers are used to indicate like and corresponding parts.

For the purposes of this disclosure, an information handling system may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, entertainment, or other purposes. For example, an information handling system may be a personal computer, a PDA, a consumer electronic device, a network storage device, or any other suitable device and may vary in size, shape, performance, functionality, and price. The information handling system may include memory, one or more processing resources such as a central processing unit (CPU) or hardware or software control logic. Additional components or the information handling system may include one or more storage devices, one or more communications ports for communicating with external devices as well as various input and output (I/O) devices, such as a keyboard, a mouse, and a video display. The information handling system may also include one or more buses operable to transmit communication between the various hardware components.

For the purposes of this disclosure, information handling resources may broadly refer to any component system, device or apparatus of an information handling system, including without limitation processors, busses, memories, input-output devices and/or interfaces, storage resources, network interfaces, motherboards, electromechanical devices (e.g., fans), displays, and power supplies.

For the purposes of this disclosure, computer-readable media may include any instrumentality or aggregation of instrumentalities that may retain data and/or instructions for a period of time. Computer-readable media may include, without limitation, storage media such as a direct access storage device (e.g., a hard disk drive or floppy disk), a sequential access storage device (e.g., a tape disk drive), compact disk, CD-ROM, DVD, random access memory (RAM), read-only memory (ROM), electrically erasable programmable read-only memory (EEPROM), and/or flash memory; as well as communications media such wires, optical fibers, microwaves, radio waves, and other electromagnetic and/or optical carriers; and/or any combination of the foregoing.

FIG. 1 illustrates a block diagram of an example information handling system 100, in accordance with the teachings of the present disclosure. In certain embodiments, information handling system 100 may comprise a computer chassis or enclosure (e.g., a server chassis holding one or more server blades). In other embodiments, information handling system 100 may be a personal computer (e.g., a desktop computer or a portable computer). As depicted in FIG. 1, information handling system 100 may include a processor 102 and one or more information handling resources 104 communicatively coupled to processor 102.

Processor 102 may include any system, device, or apparatus configured to interpret and/or execute program instructions and/or process data, and may include, without limitation a microprocessor, microcontroller, digital signal processor (DSP), application specific integrated circuit (ASIC), or any other digital or analog circuitry configured to interpret and/or execute program instructions and/or process data. In some embodiments, processor 102 may interpret and/or execute program instructions and/or process data stored and/or communicated by one or more of information handling resources 104 and/or another component of information handling system 100.

As shown in FIG. 1, processor 102 may include a core 105, a ramp generator 108, a high-pass filter 110, a resistor 112, and an amplifier 114. Core 105 may include any system, device, or apparatus that includes logic and/or circuitry to carry out one or more functions of processor 102. As depicted in FIG. 1, core 105 may include an output pin 106 labeled "START DETECT" and an input pin 107 labeled "DETECT PULSE." Output pin 106 may be configured to switch from one logic state to another (e.g., from a voltage corresponding to a logic 0 to another voltage corresponding to a logic 1) to initiate detection of the presence of information handling resources 104 communicatively coupled to processor 102. Input pin 107 may be configured to receive one or more signals in order to determine the presence of one or more information handling resources 104 communicatively coupled to processor 102, as discussed in greater detail below.

Ramp generator 108 may be communicatively to output pin 106 and may include any system, device, or apparatus configured to output a substantially monotonically increasing linear voltage at its output in response to receiving a particular input signal at its input. For example, in response to its input switching from a logic 0 to a logic 1, ramp generator 108 may generate an output voltage at its output that increases approximately linearly from a minimum voltage (e.g., 0 volts) to a maximum voltage (e.g., 5 volts). In certain embodiments, ramp generator 108 may be implemented as a low-pass filter, such as the RC low-pass filter formed by a resistor 116 communicatively coupled to output pin 106 and a capacitor 118 communicatively coupled to resistor 116 and ground, depicted in FIG. 1, for example. In such embodiments, resistor 116 may include any two-terminal electronic component that produces a voltage across its terminals that is proportional to the electric current through it in accordance with Ohm's law, and capacitor 118 may include any two-terminal electronic component including pair of conductors separated by a dielectric such that when a voltage potential difference exists between the conductors, an electric field is present in the dielectric that stores an electrical charge. In these embodiments, the resistance of resistor 116, the capacitance of capacitor 118, and other properties of resistor 116 and capacitor 118 may be selected based on the desired characteristics of the output voltage to be produced by ramp generator 108 (e.g., slope, time constant, etc.). In other embodiments, ramp generator 108 may include an RL low-pass filter, a digital-to-analog converter, or any other suitable device, apparatus, or system for producing a desired output voltage characteristic.

High-pass filter 110 may be communicatively coupled to amplifier 114 and input pin 107, and may include any system, device, or apparatus configured to pass high-frequency signals (e.g., voltages) and attenuate (e.g., reduce the amplitude of) signals (e.g., voltages) with frequencies lower than a cutoff frequency of the high-pass filter. In certain embodiments, high-pass filter 110 may be implemented as an RC high-pass filter formed by a capacitor 122 communicatively coupled to the output of amplifier 114 and a resistor 120 communicatively coupled to capacitor 122 and ground, depicted in FIG. 1, for example. In such embodiments, resistor 120 may include any two-terminal electronic component that produces a voltage across its terminals that is proportional to the electric current through it in accordance with Ohm's law, and capacitor 122 may include any two-terminal electronic component including pair of conductors separated by a dielectric such that when a voltage potential difference exists between the conductors, an electric field is present in the dielectric that stores an electrical charge. In these embodiments, the resistance of resistor 120, the capacitance of capacitor 122, and other properties of resistor 120 and capacitor 122 may be selected based on the desired characteristics of high-pass filter 110 (e.g., time constant, cutoff frequency, etc.). In other embodiments, high-pass filter 110 may include an RL high-pass filter or any other suitable device, apparatus, or system.

Resistor 112 may be communicatively coupled to the output of ramp generator 108, both input terminals of amplifier 114, and one or more of the information handling resources 104, and may include any two-terminal electronic component that produces a voltage across its terminals that is proportional to the electric current through it in accordance with Ohm's law. In certain embodiments of information handling system 100, resistor 112 may be replaced by any other device, system, or apparatus configured to produce a voltage across the input terminals of amplifier 114 proportional to the electrical current through such device, system, or apparatus.

Amplifier 114 may be communicatively coupled at its inputs to resistor 112 and at its output to high-pass filter 110, and may be any suitable device, system, or apparatus configured to receive an input signal differential at its input terminals (e.g., current or voltage) and amplify the input differential signal by a gain to produce an output signal that is a multiple of the input signal. In some embodiments, amplifier 114 may be a unity gain amplifier having a gain of 1. Amplifier 114 may include a non-inverting amplifier, an inverting amplifier, or any combination thereof.

Information handling resources 104 may be communicatively coupled to processor 102 via a common control line 103, and may include any component system, device or apparatus of an information handling system, including without limitation processors, busses, memories, input-output devices and/or interfaces, storage resources, network interfaces, motherboards, electro-mechanical devices (e.g., fans), displays, and power supplies. As depicted in FIG. 1, each of information handling resources 104 may include a tag 124 communicatively coupled to common control line 103 and configured to identify the particular information handling resource 104. For example, tag 124 may identify the type of information handling resource (e.g., keyboard, peripheral, etc.), its manufacturer, model, and/or other characteristic. In certain embodiments, tag 124 of each information handling resource 104 may be unique, allowing specific identification of the individual information handling resources 104.

As shown in FIG. 1, each tag 124 may include a current source 126 and a diode 128. Current source 124 may be coupled to common control line 103, and may be any system, device, or apparatus that delivers or absorbs electric current. For example, in certain embodiments, current source 124 may include a transistor 132 in series with resistor 130 and communicatively coupled to common control line 103, as depicted in FIG. 1. In such embodiments, resistor 130 may include any two-terminal electronic component that produces a voltage across its terminals that is proportional to the electric current through it in accordance with Ohm's law, and transistor 132 may include any suitable electrical or electronic device which may act as a switch, such as a junction field effect transistor (JFET) as shown in FIG. 1, for example. In these embodiments, the resistance of resistor 130, the other properties of resistor 120, and the properties of transistor 132 may be selected based on the desired characteristics of current source 126.

Diode 128 may be coupled between current source 126 and ground, and may include any two-terminal device including a p-n junction which may serve as an electronic valve, such that current flows through the diode in one direction when voltage above a certain threshold or breakdown voltage of the particular diode 128 is applied to its terminals. In certain embodiments, diode 128 may comprise a Zener diode, as depicted in FIG. 1. The electrical properties of each diode 128 (e.g., threshold voltage, breakdown voltage) may be selected based on the desired characteristics of its respective tag 124. In certain embodiments, each diode 128 may have a different threshold or breakdown voltage. As will be discussed in greater detail below, the threshold or breakdown voltage of a particular diode 128 may serve as an identifying characteristic of its respective tag 124.

Although FIG. 1 depicts information handling system 100 having three information handling resources 104, information handling system 100 may have any suitable number of information handling resources 104.

An illustration of the operation of information handling system 100 may be shown by reference to FIG. 2. FIG. 2 illustrates a graph of a example voltages and currents during operation of the information handling system depicted in FIG. 1, in accordance with the teachings of the present disclosure.

A detection sequence for detecting the presence of information handling resources 104 may begin when core 105 switches output pin from one logic level to another (e.g., from a voltage corresponding to logic 0 to a voltage corresponding to logic 1). This in turn may cause ramp generator 108 to produce an approximately linearly-increasing voltage at its output, which in turn will produce an approximately linearly-increasing voltage $v_{SWEEP}$ on common control line 103, as shown in FIG. 2. As $v_{SWEEP}$ increases, it may exceed the threshold or breakdown voltage associated with one of information handling resources 104 (e.g., information handling resource 104a). For example, as shown at time $t_1$ in FIG. 2, $v_{SWEEP}$ may induce a reverse-biased voltage on diode 128a such that diode 128a may begin conducting current, thus effectively turning on current source 126a such that it generates a current $i_1$ at $t_1$. The generation of current $i_1$ increases the current $i_{TOT}$ flowing through resistor 112, thus increasing the voltage across resistor 112 and the voltage at the output of amplifier 114. High-pass filter 110 may filter out the direct current component of the voltage of the output of amplifier 114, which may cause the voltage $v_{DETECT}$ present at input pin 107 to instantaneously pulse at $t_1$ to a maximum value before decaying, as depicted in FIG. 2. The pulse may indicate to core 105 that information handling resource 104a is present. If information handling resource 104a were not present, tag 124a and its components would not be present to induce current $i_1$ at $t_1$, and thus $v_{DETECT}$ would not pulse at $t_1$, indicating to core 105 that information resource 104a is not present.

As $v_{SWEEP}$ increases, it may exceed the threshold or breakdown voltage associated with another one of information handling resources 104 (e.g., information handling resource 104b). For example, as shown at time $t_2$ in FIG. 2, $v_{SWEEP}$ may induce a reverse-biased voltage on diode 128b such that diode 128b may begin conducting current, thus effectively turning on current source 126b such that it generates a current $i_2$ at $t_2$. The generation of current $i_2$ increases the current $i_{TOT}$ flowing through resistor 112, thus increasing the voltage across resistor 112 and the voltage at the output of amplifier 114. High-pass filter 110 may filter out the direct current component of the voltage of the output of amplifier 114, which may cause the voltage $v_{DETECT}$ present at input pin 107 to instantaneously pulse at $t_2$ to a maximum value before decaying, as depicted in FIG. 2. The pulse may indicate to core 105 that information handling resource 104b is present. If information handling resource 104b were not present, tag 124b and its components would not be present to induce current $i_2$ at $t_2$, and thus $v_{DETECT}$ would not pulse at $t_2$, indicating to core 105 that information resource 104b is not present. A similar procedure to that described above may also be used to detect the presence or absence of information handling resource 104c at time $t_3$, as shown in FIG. 2.

Accordingly, processor 102 can determine which information handling resources 104 are present by asserting output pin 106, ramping the voltage $v_{SWEEP}$, monitoring pulses on input pin 107 and correlating the pulses to $v_{SWEEP}$ (e.g., based on the time that such pulse is detected after the assertion of output pin 106). If each tag 124 has a unique threshold or breakdown voltage at which it will begin to draw current, each information handling resource 104 may be identified by whether a pulse is induced at input pin 107 at the time $v_{SWEEP}$ crosses such threshold or breakdown voltage.

While discussion herein has focused on the detection of information handling resources, it is noted that the methods and systems described herein may be used to detect states other than those regarding the presence or absence of a particular information handling resource or component. For example, methods and systems similar to those described above may be used to represent a large plurality of states in an information handling system or other device by employing a single-line interface that utilizes tag presence and absence for binary encoding of states. Such implementations may yield simple two-pin (e.g., signal and ground) low-cost encoders for keyboards and/or other user input devices. A similar approach may be applied to a toy and/or other device to detect a variety of plug-in modules and performing functionality (e.g., different tasks and/or sounds) based on the modules coupled to the toy and/or other device.

Using the methods and systems disclosed herein, problems associated with detecting states in a system may be improved, reduced, or eliminated. For example, the methods and systems herein allow for multiple states to be detected using a single processor input pin, as compared to traditional approaches in which a separate pin is often needed to detect each state. As a specific example, using traditional approaches, detecting the presence or absence of ten information handling resources by a processor may require ten pins dedicated to detect presence or absence. However, using the systems and methods of this disclosure, the ten information handling resources may instead each having a unique threshold/breakdown voltage varying between one volt and five volts, with a 0.4-volt separation between each device and only one input pin of a processor may be needed to fully the presence or absence of each information handling resource.

Although the present disclosure has been described in detail, it should be understood that various changes, substitutions, and alterations can be made hereto without departing from the spirit and the scope of the disclosure as defined by the appended claims.

What is claimed is:

1. An information handling system, comprising:
   a processor configured to produce a first signal on a common control line;
   a plurality of information handling resources communicatively coupled to the processor via the common control line, each of the plurality of information handling resources including a tag having a signal threshold, the tag configured to communicate a second signal via the common control line indicating the presence of the particular information handling resource in response to the first signal exceeding the signal threshold of the tag; and
   a high-pass filter included in the processor, the high-pass filter communicatively coupled to the common control line and configured to produce a pulsed third signal in response to an increase of a magnitude of the second signal, the pulsed third signal indicating the presence of a particular information handling resource of the plurality of information handling resources.

2. An information handling system according to claim 1, wherein the first signal comprises a voltage signal.

3. An information handling system according to claim 1, wherein the first signal comprises an approximately linear monotonically increasing signal.

4. An information handling system according to claim 1, wherein the second signal comprises a current signal.

5. An information handling system according to claim 1, each tag including a current source, the current source communicatively coupled to the common control line and configured to increase a magnitude of a current of the common control line in response to the first signal exceeding the signal threshold of the tag associated with the particular information handling resource.

6. An information handling system according to claim 1, wherein the signal threshold is unique to each of the plurality of information handling resources.

7. An information handling system according to claim 1 wherein the tag is configured to identify the particular information handling resource.

8. A method for detecting state, comprising:
   producing, by a processor, a first signal on a common control line, the processor including a high-pass filter communicatively coupled to the common control line;
   receiving, at an information handling resource of a plurality of information handling resources, the first signal at a tag having a signal threshold, the plurality of information handling resources communicatively coupled to the processor via the common control line;
   communicating, by the information handling resource, a second signal from the tag indicating presence of the information handling resource in response to the first signal exceeding the signal threshold; and
   producing, by the high-pass filter, a pulsed third signal in response to an increase of a magnitude of the second signal, the pulsed third signal indicating the presence of the information handling resource.

9. A method according to claim 8, wherein the first signal is received via the common control line and the second signal is communicated via the common control line.

10. A method according to claim 8, wherein the first signal comprises a voltage signal.

11. A method according to claim 8, wherein the first signal comprises an approximately linear monotonically increasing signal.

12. A method according to claim 8, wherein the second signal comprises a current signal.

13. A method according to claim 8, further comprising increasing a magnitude of a current of the common control line in response to the first signal exceeding the signal threshold.

* * * * *